United States Patent [19]
Callahan, Jr.

[11] Patent Number: 6,104,249
[45] Date of Patent: Aug. 15, 2000

[54] HIGHLY LINEAR TRANSCONDUCTANCE CIRCUIT AND FILTER USING SAME

[75] Inventor: Michael J. Callahan, Jr., Austin, Tex.

[73] Assignee: STMicroelectronics, Inc., Carrollton, Tex.

[21] Appl. No.: 09/225,841

[22] Filed: Dec. 31, 1998

[51] Int. Cl.[7] ...................................................... H03F 3/04
[52] U.S. Cl. ........................................... 330/311; 330/296
[58] Field of Search ..................................... 330/288, 296, 330/300, 303, 311

[56] References Cited

U.S. PATENT DOCUMENTS

| | | | |
|---|---|---|---|
| 4,356,454 | 10/1982 | Sueyoshi et al. | 330/294 |
| 4,956,615 | 9/1990 | Bohme et al. | 330/288 |
| 5,304,946 | 4/1994 | Sano et al. | 330/254 |
| 5,576,646 | 11/1996 | Rezzi et al. | 327/103 |

*Primary Examiner*—Robert Pascal
*Assistant Examiner*—Henry Choe
*Attorney, Agent, or Firm*—David V. Carlson; Theodore E. Galanthay; Lisa K. Jorgenson

[57] ABSTRACT

An integrated circuit includes a transconductance circuit having a bias current generator coupled to a power supply. The bias current generator may include a current mirror circuit having an input and an output, where a current at the output is proportional to a current at the input. A first constant current source in the transconductance circuit has a first electrode coupled to the power supply. The transconductance circuit also includes first and second transistors and a diode. The diode is forward biased by the bias current generator. The first transistor has a collector coupled to a second electrode of the first constant current source and to a signal output. The second transistor has a drain coupled to an emitter of the first transistor, a source coupled to a reference voltage and a gate coupled to a signal input. The diode has an anode coupled to a base of the first transistor and a cathode coupled to a constant voltage source. The current through the diode results in a drain-source voltage of the second transistor being constant. As a result, the transconductance circuit operation is linearized, and distortion due to drain-source voltage variation in the second transistor is reduced.

29 Claims, 5 Drawing Sheets

6,104,249

HIGHLY LINEAR TRANSCONDUCTANCE CIRCUIT AND FILTER USING SAME

TECHNICAL FIELD

This invention relates generally to transconductance circuits and more particularly to highly linear transconductance circuits and filters using these transconductance circuits.

BACKGROUND OF THE INVENTION

A transconductance circuit is a practical realization of a voltage-controlled current source. Transconductance circuits find application in active filters, gyrators, oscillators and impedance transformers. Linearity is one parameter affecting transconductance circuit utility, because nonlinearities give rise to undesirable effects such as distortion.

U.S. Pat. No. 5,576,646, entitled "Transconductance Circuit With High-Linearity Double Input And Active Filter Thereof", issued to F. Rezzi et al., describes one solution to many of these problems. FIG. 1 is a simplified schematic diagram of a linearized transconductance circuit 10 taught by Rezzi et al., in accordance with the prior art. The transconductance circuit 10 includes first and second MOS FETs 12 and 14, having their sources coupled together at a first node 16, their drains coupled together at a second node 18 and their gates each coupled to one of inputs 20 and 22. The voltage at the first node 16 is a constant voltage and may be ground. A bipolar transistor 24 has an emitter coupled to the second node 18, a base coupled to a low impedance voltage source $V_{DC}$ that provides a constant voltage and a collector coupled to a constant current source 26 and to an output 28.

The transconductance circuit 10 uses the fact that a forward-biased emitter-base junction manifests a voltage that is well approximated by a piecewise linear model that assumes zero conduction below a threshold base-emitter voltage $V_{BE}$ of 0.7 volts, and that assumes a constant base-emitter voltage $V_{BE}$ of 0.7 volts after the base begins to conduct current. When this approximation is applied to the transistor 24, the drain-source voltage $V_{DS}$ of the MOS FETs 12 and 14 is approximated as $V_{DS}=V_{DC}-0.7$ volts$-V_{NODE\ 16}$, where $V_{DC}$ represents a voltage from the source $V_{DC}$ and $V_{NODE\ 16}$ represents the voltage at the node 16. As a result, the drain-source voltage $V_{DS}$ of the MOS FETs 12 and 14 is relatively constant, even with changes in operating current, reducing distortion effects due to variation in characteristics of the MOS FETs 12 and 14 with changing drain-source voltage $V_{DS}$.

However, the emitter-base junction voltage $V_{BE}$ of the transistor 24 corresponds to the voltage drop across a forward-biased diode and is actually given as:

$$V_{BE}=V_{TH}\ln(I_C/I_o), \quad\quad (Eq.\ 1)$$

where $V_{TH}$ represents a temperature-dependent variable, $I_o$ represents a constant that is a function of transistor (or diode) material and geometry and $I_C$ represents collector (or diode) current. Base-emitter voltage $V_{BE}$ variations, due to changes in collector current, give rise to drain-source voltage $V_{DS}$ variations for the FETs 12 and 14, and result in the dominant nonlinearities encountered with the transconductance circuit 10 of FIG. 1.

SUMMARY OF THE INVENTION

There is therefore a need for improved linearization in transimpedance circuits for use in active filters and other types of circuits. In one aspect, the present invention provides a transconductance building block that includes a terminal for providing a first constant voltage, a constant current source and an output coupled to one terminal of the constant current source. A first transistor has a collector coupled to the output, a base and an emitter. A diode has a cathode coupled to the constant voltage terminal and an anode coupled to the base of the first transistor. A bias current generator provides a current to the diode. A second transistor has a gate coupled to a signal input, a source coupled to a second constant voltage and a drain coupled to the emitter.

In one aspect, the bias current generator of the present invention provides a current to the diode to maintain a drain-source voltage of the second transistor at a constant value. In one aspect, the bias current generator is a constant current source. As a result of the constant drain-source voltage, nonlinearities associated with drain-source voltage variation in the second transistor are reduced, and the transconductance circuit has reduced nonlinearities and improved dynamic range.

In another aspect, the bias current generator of the present invention includes a current mirror circuit having an input and an output. A current associated with the current mirror output is proportional to, and may be equal to, a current at the current mirror input. A first transistor has a collector coupled to the output, a base and an emitter. A diode has a cathode coupled to the constant voltage terminal and an anode coupled to the base of the first transistor. A bias current generator provides a current to the diode. A second transistor has a gate coupled to a signal input, a source coupled to a second constant voltage and a drain coupled to the emitter. The current mirror input is coupled to another circuit including a third transistor that is analogous to the first transistor, but which may be scaled, i.e., be geometrically quite similar but with features having sizes that are proportional to sizes of comparable features in the first transistor. The third transistor has a base that is coupled to the base of the first transistor and to the anode of the diode. A fourth transistor has a drain that is coupled to an emitter of the third transistor, a gate that is coupled to the gate of the second transistor and a source that is coupled to the source of the second transistor. The current mirror and the third and fourth transistors collectively require greater area for implementation on an integrated circuit than a constant current source, but also provide further reduction in nonlinearities. The third and fourth transistors may be scaled versions of the first and second transistors, and the current mirror can be scaled to ratio the input and output currents appropriately.

DETAILED DESCRIPTION OF THE INVENTION

Figure 2:
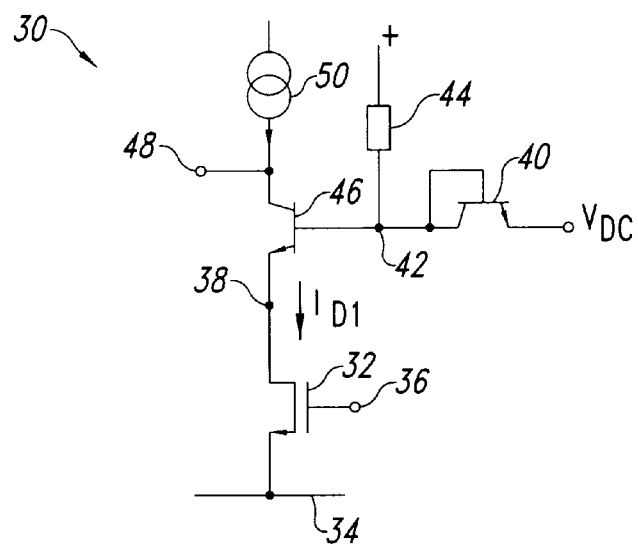
FIG. 2 is a simplified schematic diagram of a linearized transconductance circuit, in accordance with an embodiment of the present invention.

FIG. 2 is a simplified schematic diagram of a linearized transconductance circuit 30, in accordance with an embodiment of the present invention. The transconductance circuit 30 includes a NMOS FET 32 having a source coupled to a first node 34, a gate 32 coupled to an input 36 and a drain coupled to a second node 38. In one embodiment, the first node 34 is coupled to ground. A low impedance, constant voltage source $V_{DC}$ is coupled to a cathode of a diode. In one embodiment, the diode is realized as a diode-connected transistor 40, with the cathode corresponding to an emitter of the transistor 40. The transistor 40 has a base that is coupled a collector of the transistor 40, forming an anode of the diode, and both are coupled to a third node 42. A bias current element 44 is coupled to the third node 42, along with a control terminal of a transistor 46. The transistor 46 has a current-carrying electrode coupled to the second node 38. Another current-carrying electrode of the transistor 46 is coupled to an output 48 and to a constant current source 50. The bias current element 44 is a constant current source in one embodiment of the present invention. In one embodiment, the transistor 46 is a bipolar transistor having a base coupled to the third node 42, coupled to the second node 38 and a collector coupled to the output 48.

Figure 1:
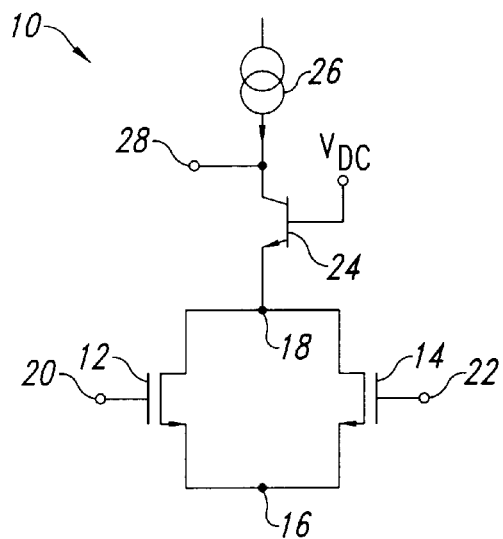
FIG. 1 is a simplified schematic diagram of a linearized transconductance circuit, in accordance with the prior art.

When input signals coupled to the gate of the NMOS FET 32 give rise to variations in a drain-source current IDS in the NMOS FET 32, variations in emitter current occur in the transistor 46, much as was the case for the transistor 24 of FIG. 1. However, in the circuit 30, $V_{DC}$ is coupled to the base of the transistor 46 through another forward-biased diode 40, such as the base-emitter junction associated with the diode-connected transistor 40.

Changing the emitter current through the transistor 46 by a small amount A causes the base-emitter voltage of the transistor 46 to change by some smaller amount, in accordance with Eq. 1. Since the base current through the transistor 46 is very small compared to the constant current from the constant-current source 44, and since $V_{DC}$ is fixed, the current through the emitter-base junction of the transistor 40 is relatively unchanged and the emitter-base voltage $V_{BE}$ of the transistor 46 has to remain constant. Further, process or temperature variations that affect one of the transistors 40 and 46 are likely to cause similar changes in the other of the transistors 40 and 46. As a result, the drain-source voltage $V_{DS}$ of the NMOS FET 32 is fixed, and any $V_{BE}$ variations due to currents in the transistors 40 and 46 cancel out.

Figure 3:
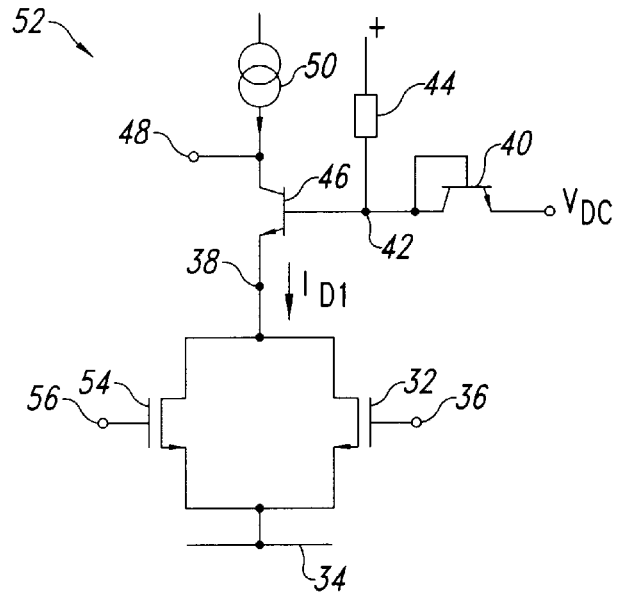
FIG. 3 is a simplified schematic diagram of a linearized dual-input transconductance circuit, in accordance with an embodiment of the present invention.

FIG. 3 is a simplified schematic diagram of a linearized dual-input transconductance circuit 52, in accordance with an embodiment of the present invention. Many of the components used in the embodiment of FIG. 3 are identical to components used in the embodiment of the transconductance circuit 30 of FIG. 2. Therefore, in the interest of brevity, these components have been provided with the same reference numerals, and an explanation of them will not be repeated.

The circuit 52 is similar to the circuit 30 of FIG. 2, but includes an additional NMOS FET 54 having a source and drain coupled to the source and drain of the NMOS FET 32 and having a gate that is coupled to a second input 56. As a result, the circuit 52 can accept two input signals having a phase shift between them and provide a linearized transconductance function, in a fashion similar to that described for the circuit illustrated in FIG. 2 of U.S. Pat. No. 5,576,646.

In the circuits 30 and 52 of FIGS. 2 and 3, the current gain β of the transistor 46 is high. In one embodiment, the current gain β of the transistor 46 is greater than 100. As a result, almost all of the current from the constant current source 44 goes through the transistor 40, forcing the voltage at the node 42 to remain constant and thereby keeping the voltage at the node 38 constant.

Figure 4A:
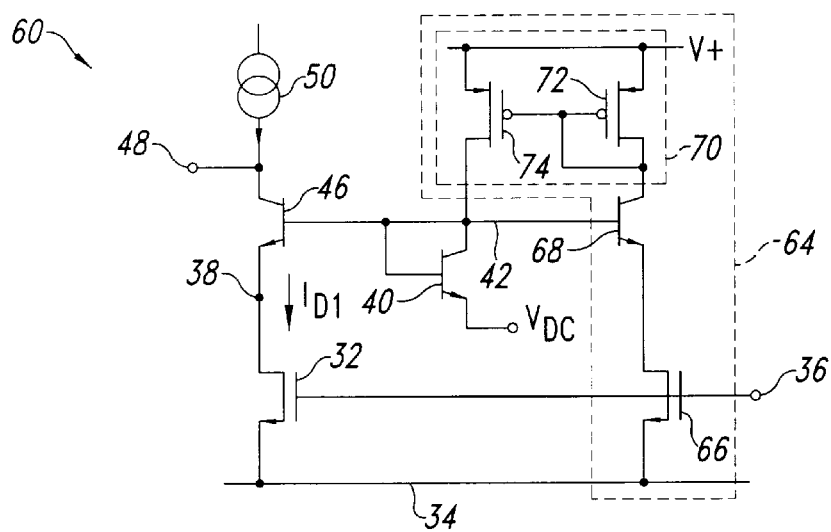
FIGS. 4A, 4B and 4C are simplified schematic diagrams of a linearized transconductance circuit, in accordance with alternative embodiments of the present invention.

FIG. 4A is a simplified schematic diagram of a linearized transconductance circuit 60, in accordance with an embodiment of the present invention. Instead of the bias current element 44 of FIGS. 2 and 3, a bias generator 64 is used.

In one embodiment, the bias generator 64 includes a transistor 66 having a source coupled to the node 34, a gate coupled to the input 36 and a drain that is coupled to an emitter of a transistor 68. The transistor 68 has a base that is coupled to the node 42 and a collector that is coupled to an input of a current mirror 70. An output of the current mirror 70 is coupled to the node 42.

In one embodiment, the current mirror 70 includes a PMOS FET 72 having a drain and gate coupled to the input of the current mirror 70 and a source coupled to a positive voltage supply V+. A PMOS FET 74 has a source and a gate that are coupled to the source and gate of the PMOS FET 72 and has a drain that is coupled to the node 42. It will be appreciated that the current mirror circuit 70 may be formed using other types of transistors, including other types of FETs or bipolar transistors, and other types of known transistors or transistors that may be developed later.

In one embodiment, the transistors 32 and 66 match each other, the transistors 40, 46 and 68 match each other and the transistor 74 has a size that is equal to that of the transistor 72. In other words, a current at the output of the current mirror 70 is equal to the current that is present at the input. The base currents to the transistors 68 and 46 are negligibly small compared to the emitter current of the transistor 40. In part, this is due to the high current gain of the transistors 68 and 46. This allows the current mirror circuit 64 to supply base currents to all three transistors 46, 40 and 68, based on the collector current of the transistor 68. In this embodiment, current through the transistor 68 matches current through the transistor 46, and this is mirrored through the current mirror 70. As a result, current through the transistor 40 matches current through the transistor 46, resulting in matching base-emitter voltages for the transistors 40 and 46, and the drain-source voltage of the NMOS FET 32 is maintained at the voltage of the constant voltage supply $V_{DC}$.

In another embodiment, various transistors in the circuit 60 are scaled to reduce total current drain and thereby reduce power consumption. Reduced power consumption is of particular concern for handheld or portable equipment, such as cellular telephones, that may use the circuits 30 or 60. In this embodiment, the transistors 66, 72 or 74 may be reduced in scale by a factor of ten or more. Alternatively, the transistors 40 or 74, or both, could be reduced in scale by a factor "m" of ten or more. These embodiments may result in DC errors that may be largely ignored with respect to the AC or high frequency performance of the circuit 60. Transistors in the circuits 30 and 52 may be similarly scaled.

In another embodiment, the transistors 66, 68 and 40 could be reduced in scale by some factor "m" to save power. The factor "m" may be ten or more. As a result, the base-emitter voltage of the transistor 40 tracks the base-emitter voltage of the transistor 46, and the voltage at the second node 38 remains essentially constant at the value $V_{DC}$. This embodiment reduces the current through the circuit 60 by almost two-thirds compared to the embodiment that employs no device scaling. Because the voltage at node 42 is $V_{BE}$ greater than $V_{DC}$, if the area and the current of the diode 40 are both reduced by a factor "m," the voltage at the node 42 will be the same as without scaling.

Figure 4B:
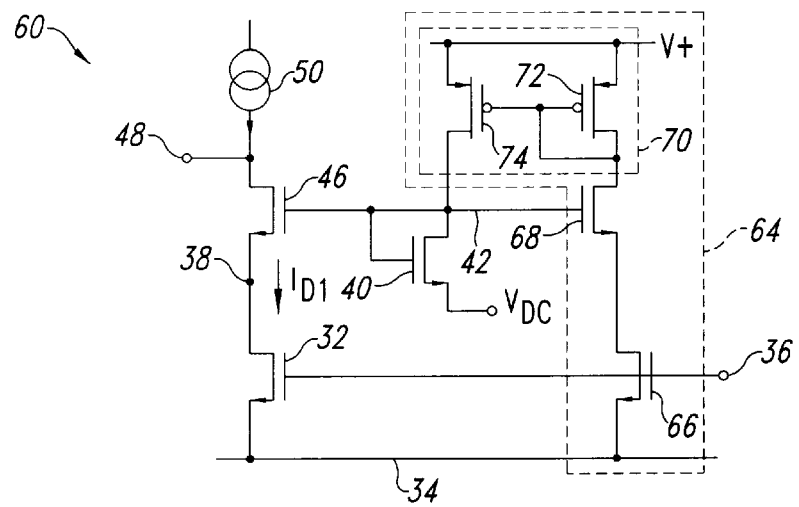

It will be appreciated that the circuit 52 of FIG. 3 may employ the bias generator 64 of FIG. 4A in the place of the constant current source 44. In general, the circuits 30 and 52 may not provide as great a linearity as the circuit 60 of FIG. 4A, however, the constant current source 44 of FIGS. 2 and 3 may be realized in much more compact form than is the case for the bias generator 64 of FIG. 4A. FIG. 4B is similar in structure and operation of 4A, but MOS transistors are used throughout the circuit.

Figure 4C:
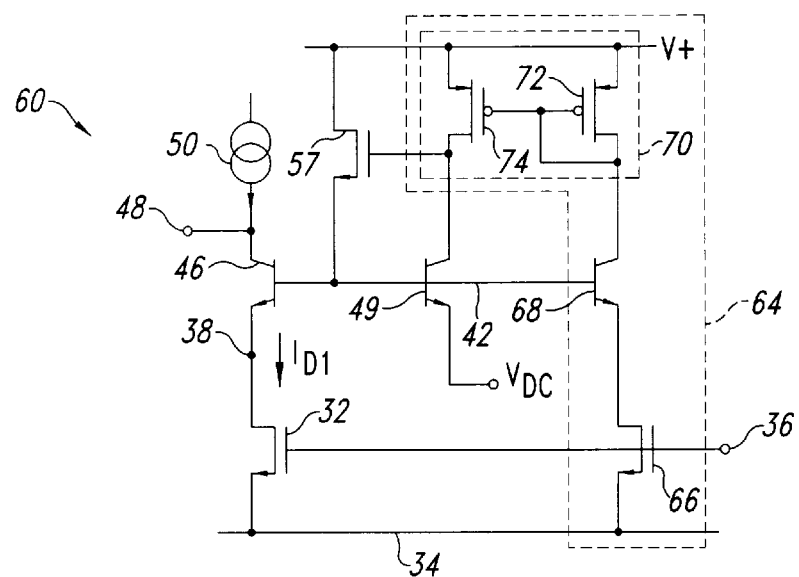

FIG. 4C is similar to 4A and 4B with the use of an additional transistor 57 having one terminal coupled to the voltage supply and another terminal connected to the base of transistor 46, node 42. The transistor 57 has its gate coupled also to the collector of transistor 49. Transistor 49 has its base coupled in common with the base of 46 and 68.

A circuit using transistor 57 has the advantage that it will reduce any error associated with the finite control terminal current of transistors 46 and 68. A diode or diode connected device, 40 is not required. Of course, the transistor 57, or its equivalent could also be used in the all MOS embodiment of FIG. 4B.

Figure 5:
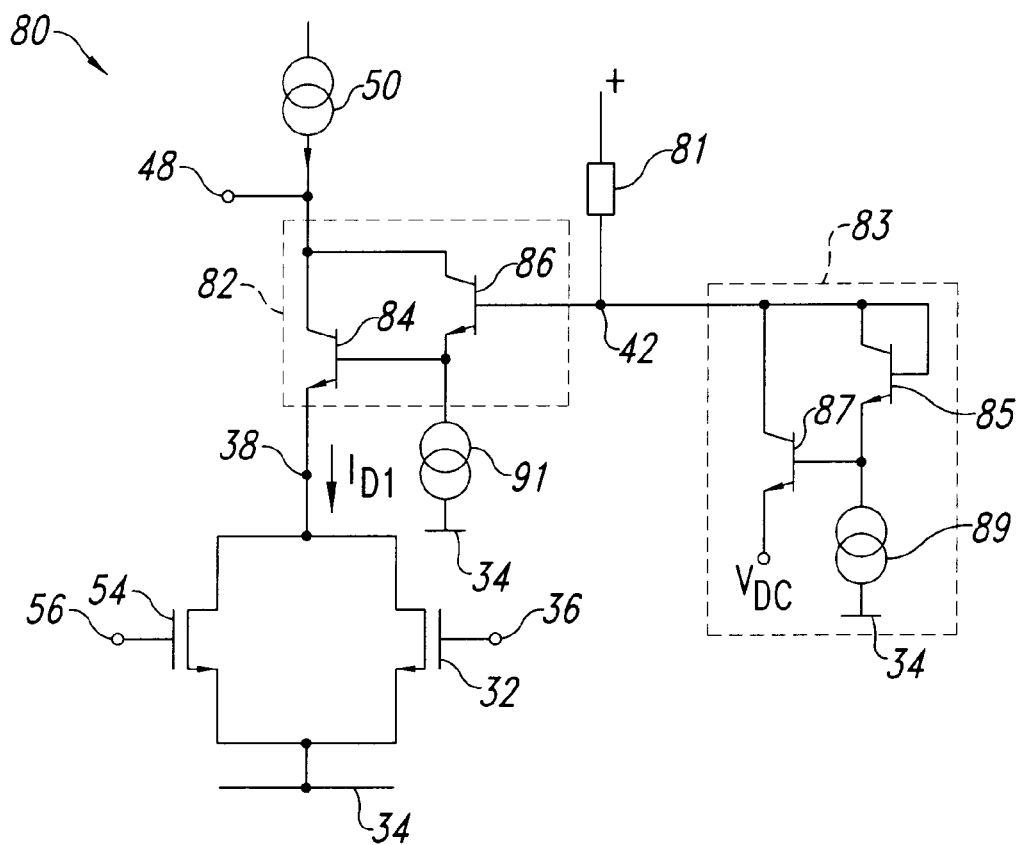
FIG. 5 is a simplified schematic diagram of a linearized transconductance circuit, in accordance with an embodiment of the present invention.

FIG. 5 is a simplified schematic diagram of a linearized transconductance circuit 80, in accordance with an embodiment of the present invention. The circuit 80 uses the constant current source 44 of FIGS. 2 and 3 or the bias generator 64 of FIG. 4A as a bias source 81, but the transistor 46 of FIGS. 2–4 is replaced by a modified Darlington pair 82 and the transistor 40 may similarly be a modified Darlington pair 83.

The modified Darlington pair 82 includes one transistor 84 having an emitter coupled to the node 38 and a base coupled to an emitter of another transistor 86 and to a current source 91. A base of the transistor 86 is coupled to the node 42, and collectors of both the transistors 84 and 86 are coupled to the output 48 and to the constant current source 50. The pair 83 includes a first transistor 87, a current source 89 and a second transistor 85 connected as shown in FIG. 5.

In one embodiment, the Darlington pair 82 has a current gain β of 10,000 or more. As a result, the assumption that the base current of the transistor 46 of FIGS. 2 through 4A, corresponding to the modified Darlington pair 82, is negligible compared to the current through the transistor 40, is improved, and the drain-source voltage $V_{DS}$ on the MOS FET 32 is held constant. The circuit 80 optionally includes the FET 56 of FIG. 3. The circuit 80 also allows scaling of elements, as discussed above with reference to FIG. 4A.

The circuits 30, 52, 60 and 80 of FIGS. 2, 3, 4A–4C and 5 may be realized as monolithic integrated circuits. In some embodiments, the circuits 30, 52, 60 and 80 may be realized as BiCMOS integrated circuits. It will be appreciated that while the circuits 30, 52, 60 and 80 have been described as employing specific transistor types (e.g., NMOS FETs, PMOS FETs and bipolar junction transistors), other types of transistors may be substituted for those shown as is known in the art or as may be developed in the art.

Figure 6:
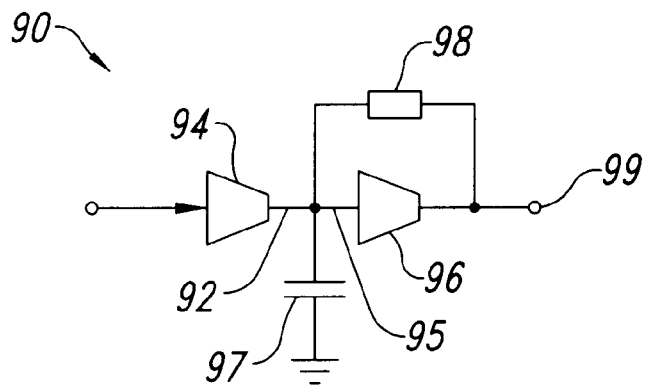
FIG. 6 is a simplified schematic diagram of a filter section using the transconductance circuit of FIGS. 2, 4 or 5, in accordance with an embodiment of the present invention.

FIG. 6 is a simplified schematic diagram of a first order active filter 90 using two of the transconductance circuits 30, 60 or 80 of FIGS. 2, 4 or 5, respectively, coupled in series, in accordance with an embodiment of the present invention. That is, an output 92 of a first transconductance circuit 94 is coupled to an input 95 of a second transconductance circuit 96. A capacitor 97 is coupled from the output 92 of the first transconductance circuit 94 to ground and a feedback network 98 is coupled from an output 99 of the filter 90 to the input 95 of the second transconductance circuit 96.

The outputs 92 and 99 correspond to the output 48 of the circuits of FIGS. 2, 4 and 5, and the input 95 corresponds to the input 36. The circuits 94 and 96 each correspond to any of the circuits 30, 60 or 80.

Figure 7:
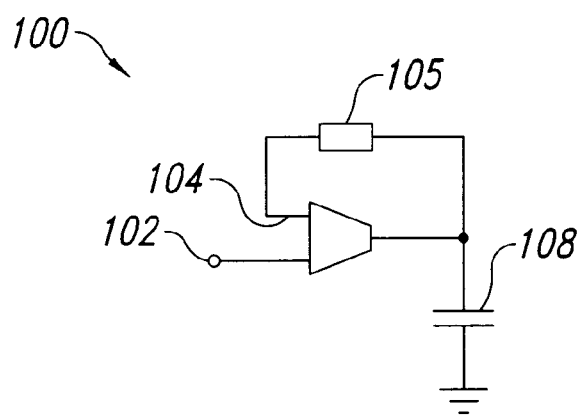
FIG. 7 is a simplified schematic diagram of a filter section using the transconductance circuit of FIG. 3, in accordance with an embodiment of the present invention.

FIG. 7 is a simplified schematic diagram of a filter 100 using the transconductance circuit 52 of FIG. 3, in accordance with an embodiment of the present invention. The filter 100 includes a first input 102 that acts as an input, a second input 104 that is coupled to a feedback network 105 and an output 106 that is coupled to a capacitor 108 and to the feedback network. The first input 102 corresponds to the input 36, the second input corresponds to the second input 56 and the output 106 corresponds to the output 48 of FIG. 3. It will be appreciated that the filter 100 may be embodied with the Darlington pair 82 of FIG. 5 substituted for the transistor 46, and that the bias generator 64 of FIG. 4A maybe substituted for the bias current element 44 of FIG. 3.

The circuits 90 and 100 of FIGS. 6 and 7 realize transconductance building blocks that are used to provide filtering functions as described in U.S. Pat. No. 5,576,646. The circuits 90 and 100 also can be formed using a conventional BiCMOS process.

It will be further appreciated that a composite filter function may be realized by combining multiple examples of the filters 90 and 100 of FIGS. 6 and 7 in cascade together with feedback loops as appropriate. Such filters find application as monolithic frequency selection components in a variety of host devices for applications such as portable telephones. These filters provide size and weight advantages in such applications, especially when combined with other components used in the host device to form a single integrated circuit.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A linearized transconductance circuit comprising:

a terminal for receiving a first reference voltage;

a diode having a cathode coupled to the terminal and an anode;

a first transistor having a first current-carrying terminal, a control terminal coupled to the anode and a second current-carrying terminal;

a bias current generator coupled to the anode and providing an anode current to the diode and a bias current to the control terminal of the first transistor;

a source of current coupled to the first current-carrying terminal of the first transistor;

an output coupled to the first current-carrying terminal of the first transistor; and a second transistor having a control electrode coupled to a signal input, a first current-carrying terminal coupled to a second reference voltage and a second current-carrying terminal coupled to the second current-carrying terminal of the first transistor.

2. The circuit of claim 1, further comprising a third transistor having a gate coupled to a second signal input, a source coupled to the first current-carrying terminal of the second transistor and a drain coupled to the second current-carrying terminal.

3. The circuit of claim 1 wherein the bias current generator provides a bias current resulting in a constant voltage for the second transistor.

4. The circuit of claim 1 wherein the bias current generator comprises a constant current source.

5. The circuit of claim 1 wherein the source of current is a constant current source.

6. The circuit of claim 1 wherein the diode comprises a third transistor having an anode formed by coupling a collector to a base of the third transistor and a cathode formed by an emitter of the third transistor.

7. The circuit of claim 1 wherein the circuit is a BiCMOS integrated circuit.

8. The circuit of claim 1 wherein the bias current generator comprises:
 a current mirror having an input and an output, the output of the current mirror coupled to the control electrode of the first transistor;
 a third transistor having a collector coupled to an input to the current mirror, a base coupled to the output of the current mirror and an emitter; and
 a fourth transistor having a source coupled to the second reference voltage, a gate coupled to the signal input and a drain coupled to the emitter of the third transistor.

9. The circuit of claim 8 wherein the first and third transistors are identical, the second and fourth transistors are identical and the first and third transistors each have a current gain of greater than one hundred.

10. The circuit of claim 8 wherein the current mirror comprises:
 a first PMOS FET having a source coupled to a power supply and a drain and a gate forming the current mirror input; and
 a second PMOS FET having a source coupled to the power supply, a gate coupled to the gate of the first PMOS FET and a drain forming the current mirror output.

11. The circuit of claim 1 wherein the diode is formed from a third transistor having a base and a collector coupled together to form the anode, the third transistor having an emitter forming the anode and wherein the third transistor is scaled compared to the first transistor.

12. The circuit of claim 1 wherein the diode has an area that is scaled compared to an area of the first transistor.

13. The circuit of claim 1 wherein the first transistor comprises a Darlington pair.

14. The circuit of claim 13 wherein the Darlington pair has a current gain in excess of ten thousand.

15. An integrated circuit including:
 a first source of current having a first terminal coupled to a power supply;
 a first transistor having a first terminal coupled to a second terminal of the first source of current and to a signal output, a second terminal and a control terminal;
 a second MOS device transistor having a first terminal coupled to the second terminal of the first transistor, a second terminal coupled to ground and a control terminal coupled to a signal input; and
 a circuit supplying a control current proportional to a current through the first transistor, said circuit operating as a transconductor;
 a diode having a first terminal coupled to the control terminal of the first transistor and a second terminal coupled to a reference voltage.

16. The circuit according to claim 15 wherein the control current passes through a first impedance device to provide a reference voltage on the control terminal of the first transistor.

17. The circuit according to claim 15 wherein the value of the control current varies to maintain a selected voltage on the first terminal of the second transistor.

18. The circuit of claim 15 wherein the current mirror circuit comprises:
 a first FET having a control terminal, a first terminal and a second terminal, the first terminal coupled to the power supply, the second terminal and the control terminal forming the current mirror circuit input; and
 a second FET having a control terminal coupled to the control terminal of the first FET, a first terminal coupled to the power supply and a second terminal forming the current mirror circuit output.

19. The circuit of claim 15 wherein the first transistor is a NPN bipolar transistor, the first terminal is a base, the first current electrode is a collector and the second current electrode is an emitter.

20. The circuit of claim 15 wherein the second transistor is a NMOS FET, the control terminal is a gate terminal, the first terminal is a drain and the second terminal is a source.

21. The circuit of claim 15 wherein the diode is formed from a NPN bipolar transistor, the first terminal is formed from a collector and a base of the NPN bipolar transistor and the second terminal is formed from an emitter of the NPN bipolar transistor.

22. The circuit of claim 15 wherein all of the transistors are MOS transistors and the diode is formed from a MOS transistor, the first electrode is formed from a drain and a gate of the MOS transistor and the second electrode is formed from a source of the MOS transistor.

23. A continuous-time filter including a plurality of filter active elements interconnected in a filter network to provide a desired transfer function between an input terminal and an output terminal, at least one filter active element including a linearized transconductor circuit comprising:
 a constant current source;
 an output coupled to one terminal of the constant current source;
 a first transistor having a collector coupled to the one terminal, a base and an emitter;
 a diode having a cathode coupled to a first constant voltage source and an anode coupled to the base;
 a bias current generator forward biasing the diode; and
 a second transistor having a gate coupled to a signal input, a source coupled to a second constant voltage and a drain coupled to the emitter.

24. The filter of claim 23, further comprising a third transistor having a gate coupled to a second signal input, a source coupled to the source of the second transistor and a drain coupled to the emitter.

25. A linearized transconductance circuit comprising:
 a signal input for receiving a first input signal;
 a voltage coupling element having a first terminal and a second terminal;
 a first transistor having a first current-carrying terminal, a control terminal coupled to the voltage coupling element and a second current-carrying terminal;
 a bias current generator coupled to the voltage coupling element for providing a biasing signal to the first transistor; and
 a second transistor having a first current-carrying terminal coupled to the second current-carrying terminal of the first transistor, a second current-carrying terminal coupled to a reference node and a control terminal coupled to the signal input.

26. The circuit of claim 25 wherein the voltage coupling element is arranged to have a voltage representative of the first transistor, and which varies in accordance with an operating current of the first transistor.

27. An integrated circuit including:

a first source of current having a first terminal coupled to a power supply;

a first transistor having a first terminal coupled to a second terminal of the first source of current and to a signal output, a second terminal and a control terminal;

a second transistor having a first terminal coupled to the second terminal of the first transistor, a second terminal coupled to ground and a control terminal coupled to a signal input; and a circuit supplying a control current proportional to a current through the first transistor, the value of the control current varying to maintain a selected voltage on the first terminal of the second transistor.

28. An integrated circuit including:

a first source of current having a first terminal coupled to a power supply;

a first transistor having a first terminal coupled to a second terminal of the first source of current and to a signal output, a second terminal and a control terminal;

a second transistor having a first terminal coupled to the second terminal of the first transistor, a second terminal coupled to ground and a control terminal coupled to a signal input; and a circuit supplying a control current proportional to a current through the first transistor, the control current passing through a first impedance device to provide a reference voltage on the control terminal of the first transistor.

29. The circuit according to claim 27 further including a diode having a first terminal coupled to the control terminal of the first transistor and second terminal coupled to a reference voltage.

* * * * *